United States Patent [19]

Kuyel

[11] Patent Number: 4,644,576
[45] Date of Patent: Feb. 17, 1987

[54] METHOD AND APPARATUS FOR PRODUCING X-RAY PULSES

[75] Inventor: Birol Kuyel, Hopewell Township, Mercer County, N.J.

[73] Assignee: AT&T Technologies, Inc., Berkeley Heights, N.J.

[21] Appl. No.: 727,470

[22] Filed: Apr. 26, 1985

[51] Int. Cl.[4] .............................................. H05H 1/34
[52] U.S. Cl. ..................................... 378/119; 378/34; 378/122; 250/492.2; 313/362.1; 313/231.01; 313/231.51
[58] Field of Search .................................. 378/34–35, 378/119, 121–122, 141; 250/492.2; 239/292, 558; 313/362.1, 231.01, 231.51; 376/127–130

[56] References Cited

U.S. PATENT DOCUMENTS

| 3,646,475 | 2/1972 | Taylor | 313/231.01 |
| 4,065,351 | 12/1977 | Jassby et al. | 376/130 |
| 4,080,549 | 3/1978 | Creedon et al. | 315/98 |
| 4,184,078 | 1/1980 | Nagel et al. | |
| 4,185,202 | 1/1980 | Dean et al. | 250/492 A |
| 4,229,232 | 10/1980 | Kirkpatrick | 148/1.5 |
| 4,238,706 | 12/1980 | Yoshihara et al. | 313/330 |
| 4,242,588 | 12/1980 | Silk et al. | 250/492 A |
| 4,258,262 | 3/1981 | Maldonado | 250/419 |
| 4,266,136 | 5/1981 | Duinker | 250/445 T |
| 4,359,660 | 11/1982 | Smith et al. | 378/119 |
| 4,408,338 | 10/1983 | Grobman | 378/34 |
| 4,494,043 | 1/1985 | Stallings et al. | |

FOREIGN PATENT DOCUMENTS 2551614 3/1985 France ............................. 378/34

OTHER PUBLICATIONS

"X-Ray Lithography Using a Pulsed Plasma Source", by Pearlman et al., J. Voc. Sci. Technol., 19(4), Nov./Dec. 1981, pp. 1190–1193.
Shikanov, A. S., "Interaction of High-Power Optical Radiation with a Superdense Plasma in the Kal'MAR Installation", *Soviet Laser Research*, (USA), vol. 1, No. 2, (Apr.–Jun. 1980), pp. 127–160.
The article "P-E Bell Labs Developing X-Ray Stepper System", by Mark Mehler, published in the Jan. 10, 1984 issue of Electronic News at p. 1.
"Gas Plasmas Yield X-Rays for Lithography", *Electronics*, Jan. 27, 1982, pp. 40 and 41.
Maxwell Laboratories, Inc. Product Bulletin MLB-20-01A entitled "Lexis II Soft X-Ray Source".

*Primary Examiner*—Craig E. Church
*Assistant Examiner*—John C. Freeman
*Attorney, Agent, or Firm*—R. B. Levy

[57] ABSTRACT

A plasma source (34, 150) for producing a pulse of soft x-rays includes a tubular cathode electrode (76) concentric within, and surrounded by a generally cylindrical anode electrode (44). A fast-acting gas valve (101, 152) discharges a plurality of inclined gas streams between the anode electrode (44) and cathode electrode (76) to form a gas shell (122, 176). Just after the shell is formed, a large, time varying voltage is transmitted to the anode and cathode electrodes to produce an intense electric field therebetween which ionizes the shell, transforming it into a sheath of plasma which collapses. The collapse of the plasma sheath yields a hot dense volume of plasma which radiates a burst of soft x-rays useful for lithographic purposes.

13 Claims, 5 Drawing Figures

METHOD AND APPARATUS FOR PRODUCING X-RAY PULSES

TECHNICAL FIELD

The instant invention relates to a method and apparatus for producing pulses of soft x-rays for lithographic applications.

BACKGROUND OF THE INVENTION

The process of using x-rays to replicate a pattern on a substrate is known as x-ray lithography. A mask made from an x-ray transparent material, such as boron nitride, having a thin pattern of gold thereon which is the negative image of the pattern of interest, is interposed between an x-ray source and a resist-coated substrate. When an x-ray beam is directed through the mask, the gold pattern on the boron nitride absorbs those x-rays impinging thereon. The x-rays impinging on the portions of the mask not covered by the gold pattern pass therethrough and strike the resist on the substrate. Once the resist is developed, the pattern is fixed on the substrate.

Using x-rays affords the advantage that particulates, which print on the substrate as defects during the lithography process when light in visible and ultraviolet (optical) wavelength range is used, become transparent when the substrate is exposed to radiation in the x-ray range. Further, diffraction effects result from using light in the optical wavelength range and limit the minimum achievable line width. Such diffraction effects are reduced by using x-ray radiation, allowing finer line widths to be achieved.

In the past, x-ray lithography has been practiced using electron impact sources which operate by directing electrons at a target material, which in turn radiates x-rays. Electron impact sources are not well suited for semiconductor x-ray lithography applications because the intensity of the x-rays produced thereby is low, requiring long exposures for each wafer, thereby limiting wafer throughput.

Moreover, electron impact sources have a large spot size, which is to say, if the x-ray source were assumed to be a sphere, it would have a large radius, typically on the order of 1.5 mm. X-ray sources having a large spot size incur the disadvantage that the x-rays produced thereby appear to originate over a wide area causing blurring of the pattern around the edges thereof which impedes the replication of very fine feature sizes on a substrate spaced a distance from the mask. The blurring of the pattern around the edges thereof due to the large spot size is referred to in the art as the penumbra effect.

Another type of x-ray source is the synchrotron which produces x-rays which are softer, that is to say of a lower energy, typically 1 keV, than those produced by electron impact sources. Synchrotron sources typically have a smaller, effective spot size as compared to electron impact sources, and thus do not suffer as much from the penumbra effect. However, synchrotron x-ray sources are not useful for routine x-ray lithographic applications because of their bulk and expense.

In addition to using impact and synchrotron x-ray sources, x-ray lithography can also be practiced using a plasma source. An example of an x-ray lithography system which utilizes a plasma x-ray source is disclosed in U.S. Pat. No. 4,184,078 issued to D. J. Nagel et al. on Jan. 15, 1980. The x-ray lithography system of Nagel et al. includes a plasma producing device, such as an exploding wire diode or gas injection diode situated in a vacuum chamber. The diode, when excited with a very large, time varying voltage from an energy source such as a capacitor bank, produces a hot, dense plasma within the chamber. The plasma radiates a burst of energy in the form of soft x-rays which are directed through a mask and onto a resist-coated substrate. For lithographic applications, gas injection and exploding wire diodes are undesirable plasma producing sources because they generate debris and are generally unpredictable in their operation.

An article "Gas Plasmas Yield X rays For Lithography" appearing at pages 40 and 41 of the Jan. 27, 1982 edition of *Electronics* magazine describes a plasma source for x-ray lithography applications. The source includes a nozzle through which a quantity of argon gas is puffed to assume the shape of a generally cylindrical shell. An intense electric field is applied to the shell to break down (ionize) the gas, transforming the shell into a sheath of plasma which passes a current axially along its surface. The current passing through the plasma generates a circumferential magnetic field which collapses the sheath, causing the plasma to become very hot and dense. The hot, dense plasma radiates a burst of energy in the form of soft x-rays. With this type of plasma x-ray source, the gas shell produced thereby is often nonuniform which may lead to unstable collapse of the plasma sheath, thereby affording poor control over the radiated x-rays.

Accordingly, there is a need for a technique for producing x-ray pulses suitable for lithographic applications.

SUMMARY OF THE INVENTION

The foregoing problems have been overcome by the method of the present invention for producing a pulse of x-rays. The method comprises the steps of: simultaneously discharging a gas through a plurality of nozzles to generate a plurality of inclined gas streams which form a shell; and ionizing the shell to yield a hot, dense volume of plasma which radiates a pulse of x-rays.

Forming the shell of a plurality of gas streams is advantageous because the shell can be readily contained substantially between two electrodes. When the electrodes are supplied with a large voltage, a field is produced which ionizes the shell, transforming it into a sheath of plasma which then collapses, yielding the hot, dense x-ray radiating volume of plasma. Any shockwave created as the dense volume of plasma expands is substantially confined between the electrodes, reducing the likelihood of damage to resist-coated substrates exposed to x-rays radiated by the volume of plasma. Making the gas streams inclined causes the plasma sheath resulting from the ionization of the shell to pass a current which is uniformly distributed along the surface of the sheath. The current passing uniformly along the surface of the sheath of plasma produces a magnetic field thereabout which interacts with the current to produce a force which radially implodes the sheath uniformly. Uniformly, imploding the sheath maximizes the compression of the volume of plasma, thereby maximizing the intensity of the x-rays radiated thereby. Typically, the compressed volume of plasma is in the form of a line so that the x-rays radiated thereby have a small spot size, which is advantageous for lithographic applications.

DETAILED DESCRIPTION

Figure 1:
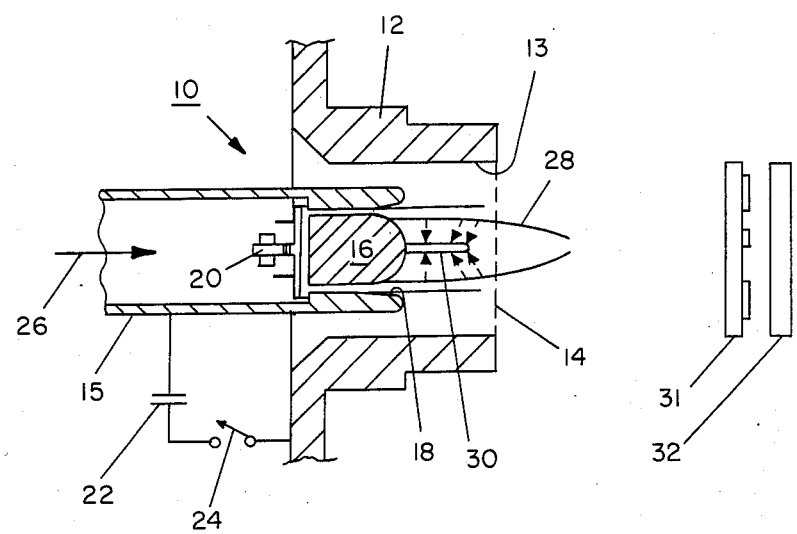
FIG. 1 is a cross-sectional view of a plasma source for producing x-rays according to the prior art.

FIG. 1 depicts a prior art apparatus 10 of the type described in the aforementioned *Electronics* magazine article for producing a plasma which radiates a pulse of x-rays useful for lithographic applications. The apparatus 10 is comprised of an electrically conductive housing 12 having an opening 13 therein covered by a conductive mesh 14. Within the housing 12 is an electrically conductive tube 15. A bullet shaped member 16 is coaxially mounted within the tube 15 so as to be spaced from the inside surface thereof, thereby creating an annular volume 18 therebetween. A fast acting gas-valve 20 is provided within the tube 15 behind the bullet shaped member 16 to seal the opening into the annular volume 18. A capacitor bank, represented as a single capacitor 22, is connected in series with a switch 24 between the tube 15 and the housing 12.

In operation, a gas 26, such as argon, is admitted at a supersonic velocity into the tube 15. Initially, the valve 20 is closed to prevent the gas 26 from passing into the annular volume 18. The valve 20 is then rapidly opened in short bursts to force a quantity of the gas 26 through the annular void 18 to produce a cylindrical gas shell 28. Just after the gas shell 28 is formed, the switch 24 is closed to discharge the capacitor 22 to establish an intense electric field between the mesh 14 and the tube 15. The electric field ionizes the shell 28, transforming the shell into a plasma sheath which passes currents along each of a plurality of arcs (not shown) which jump between the tube 15 and the mesh 14. The currents each generate a magnetic field thereabout which interacts therewith to produce a radially inwardly directed force which implodes the sheath into a smaller volume 30.

As the sheath implodes, the work done in compressing the sheath is given off as heat which causes the plasma therein to become very hot and dense. The hot plasma loses energy by radiating a burst of x-rays which are directed through a mask 31 and onto a resist-coated substrate 32 in registration with the bullet shaped member 16.

The mesh 14 overlying the opening 13 into the housing 12 allows portions of the gas shell 28 to pass therethrough. As a result, back pressure and turbulence is avoided, which would distort the cylindrical shape of the shell 28 and adversely affect the collapse of the plasma sheath into which the shell is transformed upon the ionization thereof. However, any shock waves and debris created as the sheath implodes also pass through the mesh 14 and will likely impinge on the substrate causing possible damage thereto.

Figure 2:
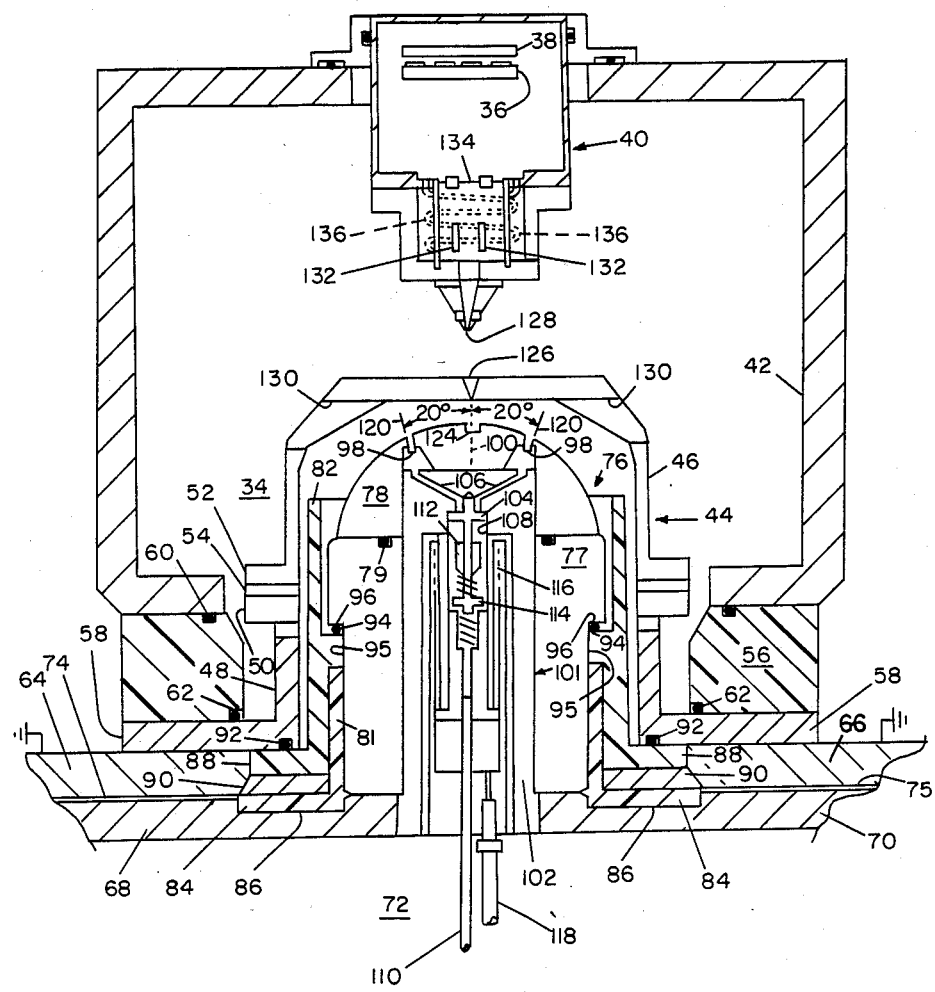
FIG. 2 is a cross-sectional view in elevation of an illustrative embodiment of a plasma source for producing x-rays according to the teaching of the present invention.

Depicted in FIG. 2 is a cross-sectional view of an x-ray source 34, constructed in accordance with the teachings of the present invention for producing pulses of soft x-rays (e.g., 1 keV) which are directed through a mask 36 to expose selected areas of an x-ray resist (not shown) applied on a substrate 38 such as a semiconductor wafer. The mask 36 and the substrate 38 are mounted in spaced relationship (typically 25 $\mu$m apart) by suitable means (not shown) within a baffle chamber 40 having a removable door (not shown). The baffle chamber 40 is mounted at the upper end of an evacuated housing 42 which mounts the x-ray source 34 at the lower end thereof in registration with the mask 36 and substrate 38.

The x-ray source 34 comprises a generally tubular anode electrode 44 which extends upwardly into the housing 42 through an opening at the bottom thereof. The anode electrode 44 is configured of an electrically conductive cup 46 (e.g., stainless steel) and an electrically conductive cylindrical member 48 (e.g., stainless steel) having a flanged lip 50 at its upper end for mounting to a flanged lip 52 at the bottom of the cup by screws (not shown). A compressible copper washer 54 is interposed between the lip 52 on the cup 46 and the lip 50 at the upper end of the cylindrical member 48 to insure a good electrical connection therebetween.

A plastic insulative washer 56 is secured in place by screws (not shown) between a flanged lip 58 at the bottom of the cylindrical member 48 and the bottom of the housing 42. Each of a pair of 0 rings 60 and 62 is interposed between the housing 42 and the washer 56 and between the washer and the flanged lip 58, respectively, to seal the respective opening therebetween which would otherwise cause a loss of vacuum in the housing.

A portion of the flanged lip 58 at the bottom of the cylindrical member 48 rests on each of two horizontal, laterally spaced plates 64 and 66. The plates 64 and 66 are each supported by a separate one of a pair of horizontal plates 68 and 70 which are laterally spaced slightly farther apart. The plates 68 and 70 each rest on an insulated frame 72. The plates 64, 66, 68 and 70 are typically aluminum and are made rigid to support both the cylindrical member 48 as well as the housing 42 from the frame 72. The plates 64 and 66 are each coupled to circuit ground and are each electrically insulated from each of the plates 68 and 70, respectively, by each of a pair of insulators 74 and 75, respectively. Each of the insulators 74 and 75 is typically comprised of a plurality of thin sheets of Mylar brand plastic made by DuPont Company, Wilmington, Del.

Within the anode electrode 44 is a cathode electrode 76 comprised of a metal tube 77 (e.g., brass) whose walls are thick enough to permit a metallic hemispherical head 78 (e.g., copper) to be mounted to the upper end thereof by screws (not shown) for electrical contact therewith. An 0 ring 79 is provided between the hemispherical head 78 and the top of the tube 77 to seal the opening therebetween.

The tube 77 has an outer diameter greater than the lateral spacing between the plates 64 and 66 to allow the tube to be received therebetween. The inner diameter of the tube 77 is made less than the spacing between the plates 68 and 70 to allow the tube to be supported therefrom. Screws (not shown) are provided to secure the tube 77 to the plates 68 and 70.

The cathode electrode 76 is insulated from the anode electrode 44 by inner and outer plastic sleeves 81 and 82, respectively, concentric about the tube 77. The inner sleeve 81 is provided with a flanged lip 84 at the bottom thereof so that a portion of the lip sits in a recess or pocket 86 in the top surface of each of the plates 68 and 70. The outer sleeve 82 is provided with a flanged lip 88 at the bottom thereof, which is of a diameter slightly less than the lateral spacing between the plates 64 and 66. The lip 88 rests on a compliant insulative ring 90 supported by the spacers 74 and 76. The ring 90 is casted of a room temperature vulcanizing (RTV) sealant so as to seal the opening between the lip 88 and the plates 64 and 66.

An 0 ring 92 is interposed between the lip 88 on the sleeve 82 and the lip 58 on the cylindrical member 48 to seal the opening therebetween. To seal the opening between the tube 77 and the sleeve 82, an 0 ring 94 is interposed between a shelf 95 extending inwardly from the inside surface of the sleeve and a flanged lip 96 at the upper end of the tube. The 0 rings 92 and 94 provide a vacuum seal between the anode and cathode electrodes 44 and 76, respectively.

The hemispherical head 78 has a plurality of nozzles or passages 98—98 therein which are equally spaced about a circle whose center lies along a dashed vertical line 100 which is coaxial with the anode and cathode electrode 44 and 76. Each nozzle 98 is inclined at a small angle, typically 20° with respect to the line 100. Each nozzle 98 is also inclined at a small angle, typically 20°, with respect to a plane passing through the base of the nozzle and the line 100

The nozzles 98—98 are each supplied with an easily ionizable gas, such as argon, from a gas supply (not shown) via a fast-acting gas valve 101. The gas valve 101 comprises a casing 102 which is received within the tube 77. Within the casing 102 is a spring biased piston 104 which releasably seals each of a plurality of passages 106—106 in the casing from a central plenum 108. Each passage 106 communicates with a separate one of the nozzles 98—98 whereas the central plenum 108 is connected to the gas supply via a conduit 110.

A spring biased sleeve 112 is slidably mounted on the piston 104 for reciprocatable movement thereon to and from a stop 114 at the bottom of the piston. The sleeve 112 and the piston 104 are circumscribed by a coil 116 mounted within the casing 106. A cable 118 connects the coil 116 to a power supply (not shown), such as a capacitor bank, capable of supplying a large time varying voltage, typically 10 KV.

In operation, gas is admitted through the conduit 110 into the plenum 108 at a supersonic velocity. While the piston 104 remains spring biased against the passages 106—106, the gas valve 101 is closed. However, when a large momentary voltage is applied to the coil 116, magnetic lines of force (not shown) are then produced which rapidly accelerate the sleeve 112 downwardly along the piston 104 against the stop 114 thereon. The impact of the sleeve 112 against the stop 114 biases the piston 104 out of sealing engagement with the passages 106—106 to rapidly open the valve 101. Once the voltage applied to the coil 116 dissipates, the piston 104 moves back into sealing engagement with the passages 106—106, closing the valve 101.

Figure 3:
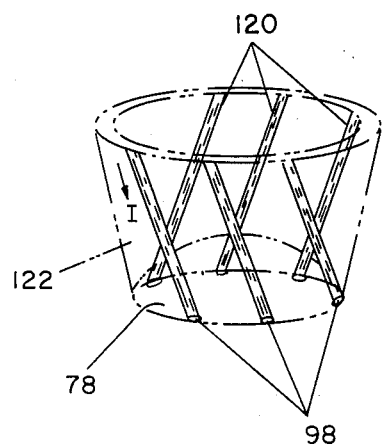
FIG. 3 is a perspective view of a gas shell produced by the plasma source of FIG. 2.

During the brief interval that the coil 116 of the gas valve 101 is energized, gas is discharged through each nozzle 98 in the form of an inclined stream 120, resulting from the inclination of each nozzle. Since the nozzles 98—98 are spaced in a circle, the gas streams 120—120 are spaced likewise and form a frusto-conically shaped shell 122 as illustrated in FIG. 3. Typically, there are a large number of streams 120-120 and only a small number have been shown in FIG. 3 for ease of illustration.

Referring to FIG. 2, just after the shell 122 (FIG. 3) is formed, each of a pair of low inductance capacitor units of a single capacitor bank (not shown) is discharged across a separate one of the pairs of plates 64 and 68, and 66 and 70, respectively. Each pair of plates 64 and 68, and 66 and 70 acts as a low inductance transmission line to carry voltage from a separate one of the pair of capacitor units to the anode electrode 44 and the cathode electrode 76. The reason for providing two capacitor units and two transmission lines to carry the voltage therefrom to the anode and cathode electrodes 44 and 76, respectively, is to provide symmetrical current paths which assures a uniform current between the electrodes. In the region in front of, and behind the cylindrical member 52, which regions are not shown in FIG. 2, the MYLAR brand plastic sheets comprising the spacers 74 and 76 are interleaved to avoid arcing between the plates 64 and 68 and 66 and 70.

The electric field produced between the anode and cathode electrodes 44 and 76, respectively, ionizes the gas in each stream 120 causing electrons to be stripped therefrom. As electrons are stripped from the streams 120—120, the shell 122 is transformed into a sheath of plasma. The plasma sheath passes a current $\bar{I}$, which flows along the surface thereof as indicated by the arrows in FIG. 3. The current $\bar{I}$ produces a magnetic field $\bar{B}$ which, as indicated by the arrows, circumscribes the sheath. The magnetic field interacts with current $\bar{I}$ to produce a radially inwardly directed force which collapses the plasma sheath. Typically, when a 60 KV voltage pulse is applied between the anode and electrode 44 and 76, respectively, the current passing through the plasma sheath reaches a maximum value of 0.6 megamps, causing the sheath to implode in about 0.75 $\mu$ seconds.

The collapse of the sheath is advantageously made uniform by making each gas stream 120 inclined. When each gas stream 120 is inclined, the electric current $\bar{I}$ which passes in the sheath will not tend to travel in an arc-like path along the streams 120—120 because that path would be longer than one along the surface of the sheath. Since current tends to travel the shortest path of least resistance, the current passing in the sheath travels along the surface thereof and will be uniformly distributed therethroughout. As a result, the magnetic $\bar{B}$ generated by the current passing in the surface of the sheath circumscribes the entire sheath, assuring a uniform collapse thereof. Were the streams 120—120 not inclined, then the resultant current would tend to be nonuniformly distributed throughout the sheath. More current would likely pass within the regions of the streams than within the regions therebetween producing a nonuniform circumferential magnetic field which would cause a nonuniform collapse of the sheath.

Upon implosion, the plasma sheath is compressed and becomes a line of plasma (not shown). The work done in compressing the plasma sheath into a line is given off as heat which causes the electrons traveling in the line of plasma to move to higher energy levels.

The line of plasma is made coaxial with the anode and cathode electrodes 44 and 76, respectively, of FIG. 2 by providing a dimple 124 in the center of the hemispherical head 78. As the plasma sheath is compressed, the current $\bar{I}$ traveling along its surface enters the head 78 within an area on the surface thereof which shrinks with the sheath until the current reaches the edge of the dimple 124. Since the current Ī travels along the shortest path between the anode and cathode electrodes 44 and 76, respectively, the current does not pass into the dimple 124. Thus, the circumference of the end of the line of plasma, along whose surface the current Ī passes, becomes coextensive with the edge of the dimple 124.

In practice, the line of plasma resulting from the implosion of the shell 122 of FIG. 3, lasts only about 100 nanoseconds and is several millimeters in length while being less than a millimeter in diameter. During its 100 nanosecond duration, the line of plasma loses a significant fraction of its internal energy as a characteristic line and Bremstrahlung radiation in the soft x-ray region of approximately 1-3 keV. Because of its very short length and small radius, the x-ray radiating line of plasma has a very small spot size which is very advantageous because the smaller the spot size, the smaller the penumbra effect.

The x-rays radiated by the line of plasma pass through an opening 126 in the top wall in the cup 46 and enter the baffle chamber 40 through an opening 128 in the bottom thereof to expose the resist on the substrate 38 through the mask 36. Typically, the opening 126 in the top wall of the cup 46 is made very small (e.g., 0.125" in diameter) to allow only a narrow beam of the x-rays to pass therethrough. As a result of the opening 126 being very small, much of the gas released by the valve 101 remains inside the cup 46. To allow the gas within the cup 46 to be drawn out therefrom very rapidly into the evacuated housing 42 to enable quick refiring of the x-ray source 34, large openings 130—130 (typically, 0.125" by 1.0" elongated slots) are provided in the sides of the cup.

In practice, each of the two capacitor units of the capacitor bank which is discharged across the anode and cathode electrodes 44 and 76, respectively, has an effective value of 2.8 $\mu$f and is charged to a voltage of approximately 60 kV by a power supply (not shown) which is capable of producing that voltage at a current of 100 ma. Using such a power supply, the capacitor units could be recharged and the source 34 could be refired every ½ minute to provide rapid pulses of soft x-rays. The speed at which the x-ray source 34 can be refired is dependent on how fast the pair of capacitor units can be recharged. Using a more powerful power supply to recharge the capacitor units very rapidly allows the x-ray source 34 to be refired several times each second.

The radiation characteristics of the x-rays produced by the source 34 are dependent on the atomic number of ionized gas. In order to maximize the Bremstrahlung radiation of the plasma, argon gas was chosen since it could be highly ionized within the x-ray source 34 without leaving many electrons within the shell of each atom. Further, it was found that the radiation produced by the plasma was typically in the wavelength range of about 4A.-12A. which is within the range most useful for x-ray lithography. Note that other gases could be used to produce line radiation having different wavelengths of interest.

Referring to FIG. 2, after the sheath is collapsed, it expands, launching a shock wave which enters the housing 42 through the openings 126 and 130—130 in the cup 46. The baffle chamber 40 advantageously blocks the shock wave from the mask 36 and substrate 38 and shields them from any debris resulting from collapse of the sheath which may be carried by the shock wave. Any gas entering the baffle chamber 40 through the opening 128, which is typically made very small (e.g., 0.125" in diameter), passes out from the chamber through larger sized openings 132—132 (typically 0.125" by 1" elongated slots) which are provided therein.

In practice, it is desirable to block any ultraviolet radiation, which may be produced upon the collapse of the shell 122 of FIG. 3, from impinging on the substrate 38. To this end, a thin, e.g., 15 micron, beryllium window 134 is provided in the baffle chamber 40 in registration with the mask 36 and substrate 38. To equalize the pressure across the window 134 to prevent damage thereto, a tube 136 is provided to connect the portion of the baffle chamber 40 lying above the window to that portion lying therebelow. The tube 136 is advantageously wound in a helix-like fashion which substantially prevents the shock wave and any debris carried thereby from passing through the tube and onto the window 134.

Figure 4:
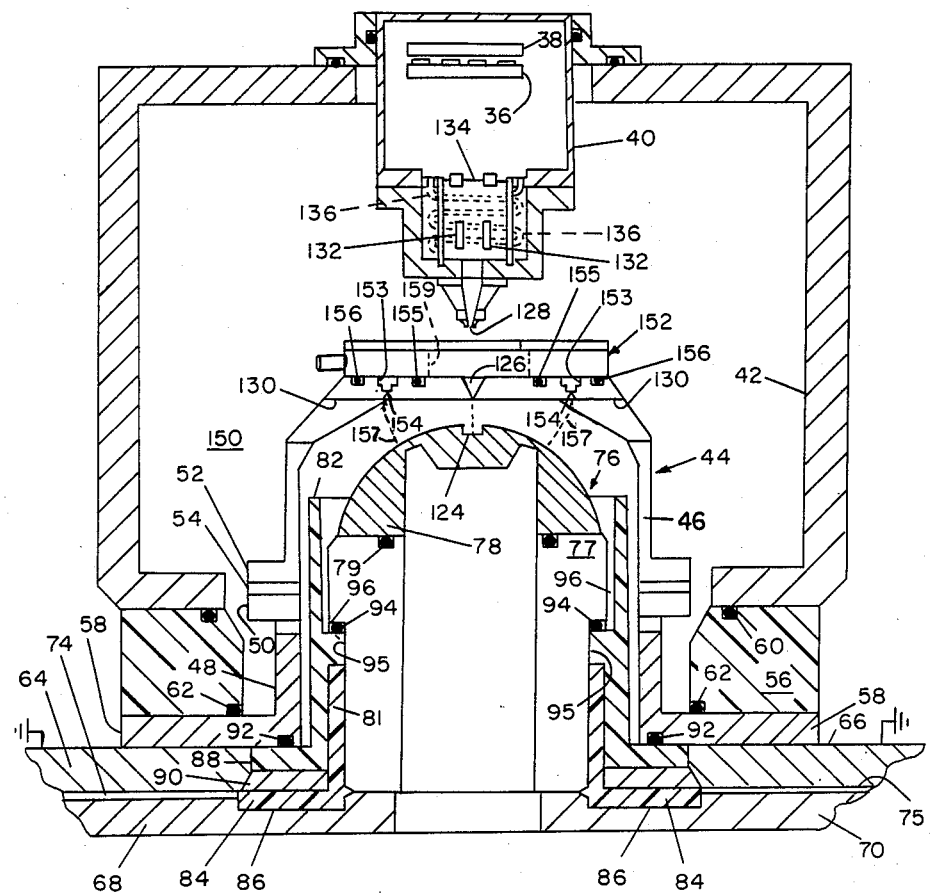
FIG. 4 is a cross-sectional view in elevation of an alternate preferred embodiment of a plasma source for producing x-rays in accordance with the present invention.

FIG. 4 shows a cross-sectional view of an alternate exemplary embodiment 150 of a plasma x-ray source The plasma x-ray source 150 of FIG. 4 is similar to the plasma x-ray source 34 of FIG. 2 and therefore, like numbers have been used in both drawings to reference like elements. However, the plasma x-ray source 150 differs from plasma x-ray source 34 of FIG. 2 with respect to the manner in which gas is admitted into the cup 46 between the anode and cathode electrodes 44 and 76, respectively.

The x-ray source 150 of FIG. 4 includes a fast-acting gas valve 152 mounted on the top of the cup 46 for admitting gas into an annular channel 153 in the top of the cup in communication with each of a plurality of openings 154—154 spaced equally distant from each other. Each opening 154 is inclined in a manner identical to each nozzle 98 in the hemispherical head 78 of the plasma x-ray source 34 of FIG. 2. Inner and outer O rings 155 and 156 are provided between the valve 152 and the top of the cup 46 concentric with the channel 153 to seal the opening between the valve and the cup.

In practice, the gas valve 152 is identical to that disclosed in copending patent application Ser. No. 727,713 for "A Method and Apparatus for Rapidly Controlling the Flow of Gas" filed in the names of B. Kuyel and P. F. Sinclair on even date herewith and assigned to the same assignee, which is incorporated by reference herein. For a more detailed description of the valve 152, reference should be made to that application.

In operation, the valve 152 is supplied with a gas, such as argon, from a gas supply (not shown). Upon actuation, the valve 152 releases gas into the channel 153. The gas entering the channel 153 is discharged therefrom into the cup through openings 154—154 in the form of gas streams 157—157. Since each of the openings 154—154 is inclined, the streams 157—157 are each inclined and form a frusto-conical shell 158 shown in FIG. 5. As compared to the shell 122 of FIG. 3, the shell 158 of FIG. 5 is inverted.

Figure 5:
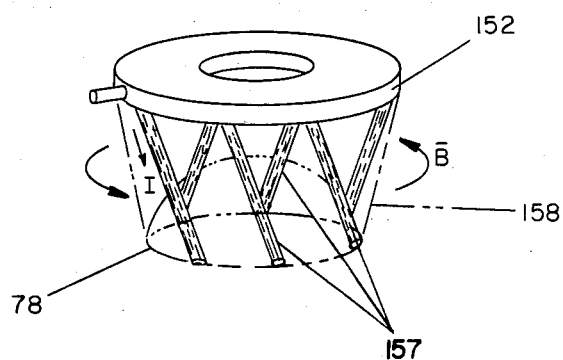
FIG. 5 is a perspective view of a gas shell produced by the plasma source of FIG. 4.

Notwithstanding the fact that the gas shell 158 of FIG. 5 is inverted as compared to the shell 122 of FIG. 3, the plasma radiation source 150 of FIG. 4 operates exactly the same as that of FIG. 2. Just after the shell 158 of FIG. 5 is formed, a large electric field is generated between the anode and cathode electrodes 44 and 76 of FIG. 4 to ionize the shell, transforming it into a sheath of plasma (not shown). The sheath implodes because of the interaction of the current passing along the surface of the sheath and the circumferential magnetic field produced by the current which results in a radially inwardly directed force on the sheath. As it implodes, the sheath is compressed into a line of plasma (not shown) which radiates soft x-rays that pass through the opening 126 in the top of the cup 46 and through an opening 159 in the gas valve 152. The x-rays enter in the baffle chamber 40 through the opening 128 therein to expose the resist on the substrate 38 through the mask 36.

An advantage afforded by the x-ray source 150 of FIG. 4 is that the gas admitted into the valve 152 travels a much shorter distance therethrough as compared to the distance traveled by the gas through the valve 101 of FIG. 2. The reduced length of gas travel through the valve 152 improves the accuracy of the mass of gas loaded into the cup 46 affording better control of the collapse of the plasma sheath resulting from the ionization of the shell 158. Further, the reduced travel time of the gas through the valve 152 decreases the likelihood that the gas will dissipate once it enters the cup 46, thereby improving the uniformity of the resultant gas shell 158 (FIG. 5). The more uniform the gas shell 158, that is to say, the more uniform the mass of gas within the cup 46, the greater the intensity of the x-ray radiation.

It is to be understood that the embodiments described herein are merely illustrative of the principles of the invention. Various modifications and changes may be made thereto by persons skilled in the art which will embody the principles of the invention and fall within the spirit and scope thereof.

What is claimed is:

1. A method for producing x-rays comprising the steps of:
    discharging a gas through each of a plurality of inclined passageways to produce a plurality of inclined gas streams which form a gas shell whose surface is traversed by each of the inclined streams at a predefined angle relative to a longitudinal path along the surface which is parallel to the axis of the shell; and
    ionizing the shell to yield a compressed volume of plasma which radiates x-rays.

2. The method according to claim 1 wherein the gas shell is ionized by applying an electric field thereto to transform the shell into a sheath of plasma which carries electric currents that generate magnetic lines of force which interact with the current to produce a radially inwardly directed force that implodes the sheath of plasma.

3. A method for replicating a pattern onto an x-ray sensitive substrate comprising the steps of:
    discharging a gas through each of a plurality of inclined passageways to produce a plurality of inclined gas streams which form a gas shell whose surface is traversed by each of the inclined streams at a predefined angle relative to a longitudinal path along the surface which is parallel to the axis of the shell;
    ionizing the gas shell to yield a dense compressed volume of plasma which radiates x-rays; and
    directing the x-rays through a mask and onto a resist-coated substrate to expose the resist and fix the pattern thereon.

4. The method according to claim 3 wherein the gas shell is ionized by applying an electric field thereto to transform the shell into the sheath of plasma which carries electric currents that generate magnetic lines of force which interact with the current to produce a radially inwardly directed force that implodes the sheath of plasma.

5. The method according to claim 3 further including the step of isolating the mask and substrate from any shock wave created upon collapse of the gas shell.

6. An apparatus for producing x-rays comprising:
    means for discharging a gas through each of a plurality of inclined passageways to produce a plurality of inclined gas streams which form a shell whose surface is traversed by each of the inclined streams at a predefined angle relative to a longitudinal path along the surface which is parallel to the axis of the shell; and
    means for ionizing the shell to yield a dense volume of plasma which radiates x-rays.

7. The invention according to claim 6 wherein said means for ionizing the gas shell comprises:
    means, responsive to a voltage applied thereto, for producing an electric field to ionize the gas streams to transform the shell into a sheath of plasma which carries an electric current which generates a magnetic field which interacts with the current to produce a radially inwardly directed force that implodes the sheath; and
    means for transmitting voltage to said electric field producing means.

8. The invention according to claim 7 wherein said electric field producing means comprises:
    a cathode electrode having a tubular body with a hemispherical head at one end thereof; and
    a cylindrical anode electrode surrounding the head and body of said cathode electrode.

9. The invention according to claim 8 wherein said voltage transmitting means comprises:
    a first pair of laterally spaced conductive plates each in contact with said anode electrode;
    a second pair of laterally spaced conductive plates, each underlying a separate one of said first pair of conductive plates and each being in contact with said cathode electrode; and
    a pair of insulator means, each separating one of said first pair of plates from one of said second pair of plates.

10. The invention according to claim 8 wherein said gas discharging means comprises:
    a plurality of inclined nozzles in the hemispherical head of the cathode electrode; and
    a fast-acting gas valve within the cathode electrode for discharging gas through each of the inclined nozzles.

11. An apparatus for producing x-rays comprising:
    a cathode electrode having a tubular body with a hemispherical head at one end thereof;
    a cylindrical anode electrode surrounding the head and body of said cathode electrode;
    a first pair of laterally spaced conductive plates each in contact with said anode electrode;
    a second pair of laterally spaced conductive plates, each underlying a separate one of said first pair of conductive plates and each being in contact with said cathode electrode, said first and second plates transmitting a voltage to said electrodes;
    a pair of insulator means, each separating one of said first pair of plates from one of said second pair of plates a plurality of inclined passages arranged in the top of said anode electrode; and a fast-acting gas valve mounted on the top of said anode electrode for discharging a stream of gas through each of the plurality of inclined passageways to produce a plurality of inclined gas streams which form a gas shell whose surface is traversed by each of the inclined streams at a predefined angle relative to a longitudinal path along the surface which is parallel to the axis of the shell; means for transmitting a voltage to the anode and cathode electrodes to create an electric field therebetween to ionize the gas shell.

12. An apparatus for producing x-rays comprising:

a cylindrical anode electrode;

a tubular cathode electrode concentric within, and surrounded by said anode electrode, said cathode electrode having a hemispherical head provided with a plurality of inclined openings therethrough;

a fast-acting gas valve for discharging a gas through the plurality of inclined openings in the cathode electrode to produce a plurality of inclined gas streams between the anode and cathode electrodes, the inclined gas streams forming the outline of a shell whose surface is traversed by each of the inclined streams at a predefined angle relative to a longitudinal path along the surface which is parallel to the axis of the shell; and means for transmitting a voltage to the anode and cathode electrodes to create an electric field therebetween to ionize the gas shell, so as to transform the shell into a sheath of plasma which implodes, yielding a compressed volume of plasma which radiates x-rays.

13. An apparatus for replicating a pattern onto a substrate having a resist coating thereon comprising:

a housing;

a baffle chamber mounted at one end of said housing for mounting an x-ray sensitive substrate;

a plasma x-ray source mounted to the other end of said housing in registration with said baffle chamber for producing x-rays which are directed into said baffle chamber said x-ray source including:

means for discharging a gas through each of a plurality of inclined passageways to produce a plurality of inclined gas streams which form a gas shell whose surface is traversed by each of the inclined streams at a predefined angle relative to a longitudinal path along the surface which is parallel to the axis of the shell;

means for ionizing the gas shell to yield a dense line of plasma which radiates x-rays; and a mask contained within said baffle chamber and interposed between said x-ray source and said substrate for selectively passing x-rays therethrough and onto the resist coating on said substrate.

* * * * *